(12) United States Patent
Schober

(10) Patent No.: US 9,905,445 B2
(45) Date of Patent: Feb. 27, 2018

(54) APPARATUS FOR REMOVING A RING-SHAPED REINFORCEMENT EDGE FROM A GROUND SEMICONDUCTOR WAFER

(71) Applicant: MECHATRONIC SYSTEMTECHNIK GMBH, Villach (AT)

(72) Inventor: Walter Schober, St. Martin/Rosegg (AT)

(73) Assignee: MECHATRONIC SYSTEMTECHNIK GMBH, Villach (AT)

( * ) Notice: Subject to any disclaimer, the term of this patent is extended or adjusted under 35 U.S.C. 154(b) by 0 days.

(21) Appl. No.: 14/903,741

(22) PCT Filed: Jul. 10, 2014

(86) PCT No.: PCT/EP2014/064877
§ 371 (c)(1),
(2) Date: Jan. 8, 2016

(87) PCT Pub. No.: WO2015/004262
PCT Pub. Date: Jan. 15, 2015

(65) Prior Publication Data
US 2016/0163571 A1    Jun. 9, 2016

(30) Foreign Application Priority Data
Jul. 10, 2013    (EP) .................................... 13175880

(51) Int. Cl.
*B32B 38/10* (2006.01)
*H01L 21/67* (2006.01)
(Continued)

(52) U.S. Cl.
CPC .. *H01L 21/67132* (2013.01); *H01L 21/67092* (2013.01); *H01L 21/67115* (2013.01);
(Continued)

(58) Field of Classification Search
CPC . B32B 38/10; B32B 43/006; Y10T 156/1132; Y10T 156/1153;
(Continued)

(56) References Cited

U.S. PATENT DOCUMENTS

| 4,403,567 A | 9/1983 | Dacosta et al. |
| 2007/0077731 A1 | 4/2007 | Masuda |

(Continued)

FOREIGN PATENT DOCUMENTS

| DE | 10 2010 007 769 A1 | 8/2010 |
| DE | 10 2010 039 798 A1 | 3/2011 |
| JP | 2007-059829 A | 3/2007 |

OTHER PUBLICATIONS

International Search Report of PCT/EP2014/064877, dated Aug. 18, 2014.

*Primary Examiner* — Mark A Osele
*Assistant Examiner* — Nickolas Harm
(74) *Attorney, Agent, or Firm* — Collard & Roe, P.C.

(57) ABSTRACT

An apparatus for removing a ring-shaped reinforcement, edge from a ground semiconductor wafer, which is cohesively connected to an elastic carrier film and is fixed to a circumferential wafer frame via the carrier film, includes a holding device, which has a support having suction openings for holding the semiconductor wafer on the support surface of the support, and a separating device, which includes a device for integrally detaching the reinforcement edge from the carrier film. In order to be able to detach the reinforcement edge from the carrier film without damage, the holder device has a clamping device encompassing the support and serving for clamping the wafer frame and/or the carrier film, wherein the clamping device interacts with the support to stretch the carrier film, and the separating device has a tool guide with a dividing tool for moving the dividing tool between carrier film and reinforcement edge in order to
(Continued)

detach the reinforcement edge in one piece from the carrier film stretched by interaction of clamping device and support.

10 Claims, 4 Drawing Sheets

(51) Int. Cl.
*H01L 21/683* (2006.01)
*B32B 43/00* (2006.01)

(52) U.S. Cl.
CPC .......... *H01L 21/6836* (2013.01); *B32B 38/10* (2013.01); *B32B 43/006* (2013.01); *H01L 2221/68381* (2013.01); *Y10T 156/1132* (2015.01); *Y10T 156/1158* (2015.01); *Y10T 156/1184* (2015.01); *Y10T 156/1917* (2015.01); *Y10T 156/1944* (2015.01); *Y10T 156/1967* (2015.01)

(58) Field of Classification Search
CPC ......... Y10T 156/1158; Y10T 156/1184; Y10T 156/1911; Y10T 156/1917; Y10T 156/1944; Y10T 156/1967
USPC ....... 156/707, 711, 712, 717, 752, 753, 758, 156/762
See application file for complete search history.

(56) References Cited

U.S. PATENT DOCUMENTS

2009/0165277 A1  7/2009  Zussy et al.
2010/0055877 A1  3/2010  Kajiyama et al.

APPARATUS FOR REMOVING A RING-SHAPED REINFORCEMENT EDGE FROM A GROUND SEMICONDUCTOR WAFER

CROSS REFERENCE TO RELATED APPLICATIONS

This application is the National Stage of PCT/EP2014/064877 filed on Jul. 10, 2014, which claims priority under 35 U.S.C. § 119 of European Application No. 13175880.7 filed on Jul. 10, 2013, the disclosures of which are incorporated by reference. The international application under PCT article 21(2) was not published in English.

TECHNICAL FIELD

The invention relates to an apparatus for removal of a ring-shaped reinforcement edge from a ground semiconductor wafer, which wafer is connected with an elastic film with material fit, and attached to a circumferential wafer frame by way of this carrier film, the apparatus having a holding device that has a support having suction openings for holding the semiconductor wafer, and having a severing device that comprises means for detachment of the reinforcement edge from the semiconductor wafer and from the carrier film, in one piece.

STATE OF THE ART

In order to be able to remove a reinforcement edge that has remained on the back side of a semiconductor wafer as the result of a grinding and severing process, it is known from the state of the art (DE102010007769A) to exert a pulse onto a carrier film onto which the semiconductor wafer is laminated. In this way, the adhesive connection between reinforcement edge and carrier film is supposed to be weakened, and subsequently, this allows the reinforcement edge to be pulled off the carrier film in one piece. However, it is disadvantageous that such impact loads also lead to shocks in the region of the active wafer surface, which, as is known, directly follows the reinforcement edge. The risk of damage to the active wafer surface with its semiconductor structures is therefore comparatively great. This particularly holds true if this is a semiconductor wafer that has been reduced in thickness using a grinding process, in order to be able to achieve a wafer thickness of less than 150 µm in this way.

According to US20100055877A1, a method for detachment of a ring-shaped reinforcement edge is disclosed, in which the carrier film of the wafer frame is irradiated from below with UV light, in order to reduce holding forces and to soften the material-fit connection. It is disadvantageous that in this way, surrounding regions and thereby also regions of the active wafer surface of the semiconductor wafer can be softened, and therefore undesirable co-detachment of active wafer surface must be expected when the reinforcement edge is lifted off. This must be feared all the more because when the reinforcement edge is lifted, the film, which is stretched between reinforcement edge and semiconductor wafer and is released in this region (see US20100055877A1: FIG. 15B), must be expected to spring back.

PRESENTATION OF THE INVENTION

The invention has therefore set itself the task of changing the design of an apparatus for removal of a reinforcement edge, of the type described initially, in such a manner that a reinforcement edge can be removed from the active wafer surface of a ground semiconductor wafer without damage. Furthermore, the apparatus is supposed to have a simple design.

The invention accomplishes the stated task in that the holding device has a clamping device that surrounds the support, for clamping the wafer frame and/or the carrier film in place, wherein the clamping device interacts with the support to produce stretching of the carrier film, and that the severing device has a tool guide having a disaggregating tool, for moving the disaggregating tool between carrier film and reinforcement edge, in order to detach the reinforcement edge from the carrier film, which is stretched by an interaction of clamping device and support, in one piece.

If the holding device has a clamping device that surrounds the support, for damping the wafer frame and/or the carrier film in place, wherein the clamping device interacts with the support to stretch the carrier film, the carrier film can be prepared for detachment of the reinforcement edge in particularly advantageous manner. This is because the carrier film, which is stretched by an interaction of clamping device and support, ensure shear stress in the adhesive connection between carrier film and reinforcement edge, thereby making it possible to weaken the adhesive connection. However, this weakening of the adhesive connection takes place without shocks, in contrast to the state of the art, and this can advantageously prevent damage to the semiconductor structures on the active wafer surface of the semiconductor wafer. In particular, the invention can also be characterized in that increased edge tension peaks form as the result of the stretched elastic carrier film. These edge tension peaks are furthermore uniformly distributed around the reinforcement edge, because of the clamping device that surrounds the support. In this way, advantageous prerequisites for mechanical detachment or lifting up of the reinforcement edge can be created, if the severing device has a tool guide having a disaggregating tool, for moving the disaggregating tool between carrier film and reinforcement edge. The disaggregating tool can thereby be set down on the reinforcement edge in a region where the material-fit connection between carrier film and reinforcement edge has been significantly weakened, and this not only facilitates pushing the disaggregating tool in between carrier film and reinforcement edge, but also prevents rupture of the reinforcement edge. According to the invention, removal of the reinforcement edge in one piece can thereby be ensured. Furthermore, the carrier film, which is stretched by means of an interaction of clamping device and support, can ensure low-vibration removal of the reinforcement edge, and this can prevent damage to the semiconductor structures of the semiconductor wafer. Furthermore, the design effort for the apparatus can also be kept low by means of the use of a chip-free disaggregating tool.

In general, it should be mentioned that the clamping device can interact with the support, to stretch the carrier film, for example by means of pulling on the carrier film. This tensile stress can be introduced into the elastic carrier film, for example, by drawing the carrier film and/or the wafer frame against the clamping device by suction, or also by means of mechanical guides, with which guide a part of the carrier film and/or of the wafer frame can be placed into its position relative to the support.

The design conditions of the apparatus can be simplified if the holding device has a guide provided between clamping device and support. Specifically, in this way a carrier film held by the clamping device and/or a held wafer frame can be transferred from a starting position into a clamped position, and this can be utilized to stretch the carrier film between clamping device and reinforcement edge. Furthermore, in this way the material-fit connection between carrier film and clamping device can be reliably weakened, and this can be utilized to increase the stability of the apparatus. With the simple design solution, the guide can be structured as a linear guide—in this connection, a swallowtail guide having increased lateral stability along the guide track can also distinguish itself.

Aside from stretching of the carrier film, weakening of the material-fit connection can also be achieved if the guide track runs at an incline relative to the support surface of the support, in order to put peeling stress on the material-fit connection between carrier film and reinforcement edge. As a result, the carrier film can literally be pulled off the reinforcement edge, wherein uniform stress on the reinforcement edge or on the carrier film can be ensured—which uniform stress occurs, during this method step, because the carrier film is stretched around the support. In this way, damage to the active wafer surface of the semiconductor wafer can be prevented. Preferably, a guide track that runs perpendicular relative to the support can further reduce the design effort for the apparatus.

The demands on the clamping device for gripping the carrier film or the wafer frame can be reduced if the guide bears the clamping device so that it can be moved from a starting position, in which it is planar with the support surface, into a clamping position, which is set back relative to the support surface. Furthermore, a set-back clamping position can ensure simplified guidance conditions for the disaggregating tool, in that the carrier film, which springs back from the reinforcement edge, can allow a freedom of movement for the disaggregating tool.

The carrier film and/or the water frame can be firmly connected with the clamping device by way of its suction openings, in stable manner and with a simple design.

If a pivot bearing is provided between holding device and disaggregating tool, design simplification can occur in the region of the disaggregating tool, to the effect that a comparatively narrow disaggregating tool can suffice for lifting up the reinforcement edge, by way of a rotation of the held semiconductor wafer along with carrier film and wafer frame.

Simplified design conditions can occur if the axis of rotation of the pivot bearing runs inclined relative to the guide axis of the tool guide, particularly perpendicular. Furthermore, a particularly advantageous severing effect between reinforcement edge and carrier film can be allowed with such a tool guide, in that the carrier film is essentially pulled off the reinforcement edge by the disaggregating tool. The mechanical stresses on the reinforcement edge can thereby be kept low, and this can be useful for removal of the reinforcement edge in one piece.

Preferably, the disaggregating tool can have a wedge blade; particularly it can be structured as a knife or splitter, in order to thereby reduce the design prerequisites of the apparatus.

The material-fit connection between carrier film and reinforcement edge can be further weakened in that the severing device has a radiation source directed at the reinforcement edge, which source softens the material-fit connection between carrier film and reinforcement edge. UV irradiation sources can particularly distinguish themselves here.

The semiconductor structures can be protected in simple manner, in terms of design, in that a shutter follows the radiation source, in order to restrict the emission of the radiation source to the reinforcement edge.

It is advantageous if the support draws the semiconductor wafer against the carrier film with suction, in order to thereby facilitate detachment of the reinforcement edge from the carrier film.

If the suction openings of the support are disposed to run around the inside of the reinforcement edge, detachment of the reinforcement edge during the severing process can be facilitated. This is because the circumferential suction openings can form a type of attachment border, from which the reinforcement edge to be detached can be removed with a lever effect.

BRIEF DESCRIPTION OF THE DRAWING

In the figures, the object of the invention is shown in greater detail, as an example, using an exemplary embodiment. The figures show.

WAY TO IMPLEMENT THE INVENTION

Figure 1:
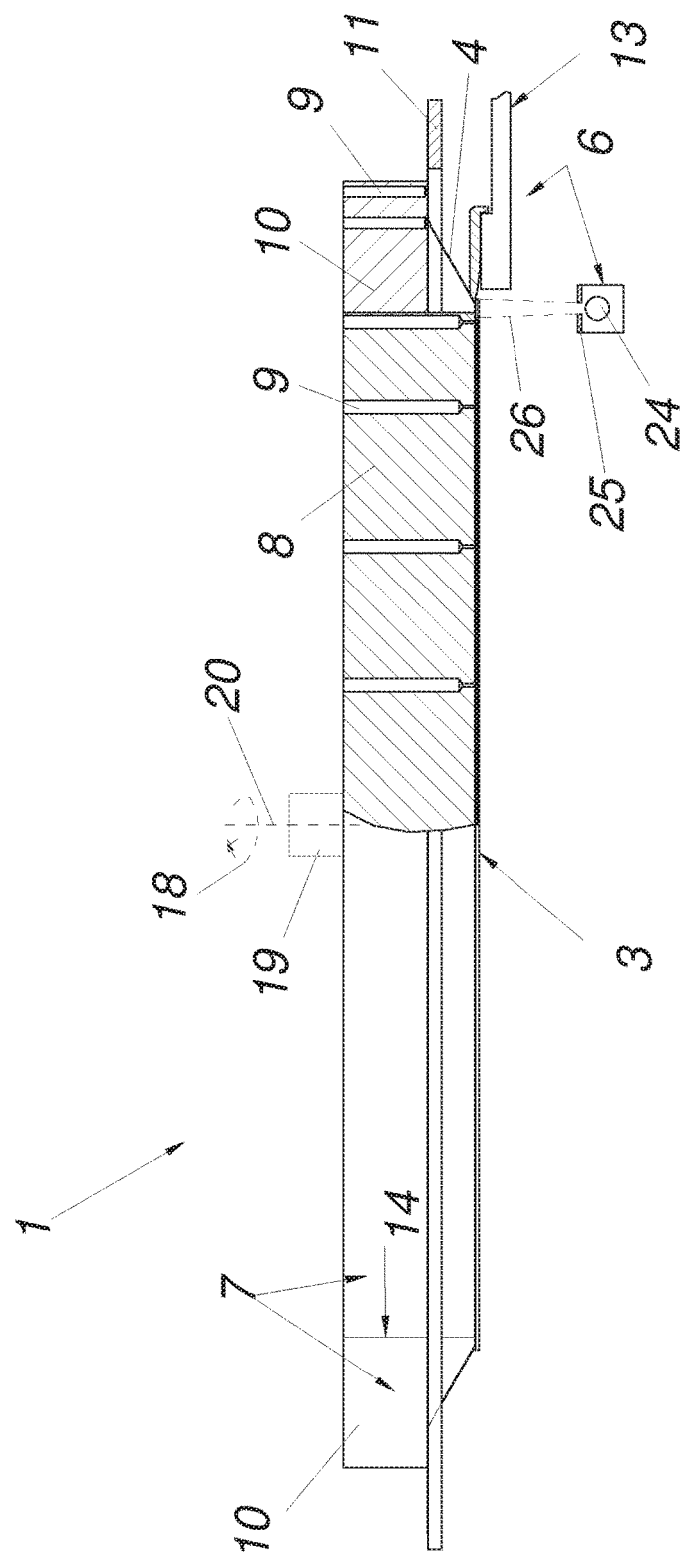
FIG. 1 a side view, partially in vertical section, of the apparatus, with semiconductor wafer, elastic support film, and wafer frame, FIG. 2 a detail view of FIG. 1, FIG. 3 a detail view of FIG. 1, with a change in the position of the clamping device 10, and FIG. 4 a top view of the apparatus, without semiconductor wafer, elastic film, and wafer frame.

In the apparatus 1 for removal of a ring-shaped reinforcement edge 2 from a ground semiconductor wafer 3, for example as shown in FIG. 1, the elastic carrier film 4 can be recognized, onto which the semiconductor wafer 3 is laminated or with which the semiconductor wafer 3 is connected with material fit. As can be better recognized in FIG. 2, the reinforcement edge 2 has already been severed from the active wafer surface 5 of the semiconductor wafer 3. Such a severing process can take place by means of a laser cut, for example. The reinforcement edge 2 is essentially formed by means of a grinding process on the back side of the semiconductor wafer 3, in order to thin its wafer surface 5, which is provided with a semiconductor structure, not shown in any detail. The reinforcement edge 2, which remains during the grinding process for stability purposes, must now be removed from the carrier film 4, in order to be able to process the semiconductor wafer 3 further. This removal, however, must proceed in such a manner that the active wafer surface 5 is not damaged during the process when a severing device 6 detaches or lifts up the reinforcement edge 2 from the carrier film 4, in one piece, using its means. This is made more difficult by the fact that during this process step, the semiconductor wafer 3 is held in place on a support 8, using suction openings 9, by a holding device 7, and thereby sensitively reacts to vibrations of the carrier film 4.

In order to achieve a high degree of freedom from damage, the invention proposes providing the holding device 7 with a clamping device 10, which surrounds the support 8 and clamps the carrier film 4 in place, specifically in such a manner that stretching of the carrier film 4 occurs. This is achieved by means of drawing in the carrier film 4, in that the clamping device 10 is also provided with suction openings 9 that draw the film against the clamping device 10. It is conceivable, but not shown in any detail, that the clamping device 10, alternatively or also additionally, introduces its clamping forces into the wafer frame 11, to which the carrier film 4 is attached, in order to thereby stretch it.

The material-fit connection between reinforcement edge 2 and carrier film 4 is thereby significantly weakened—particularly taking into consideration the elastic property of the carrier film 4 and the edge tension peaks that occur in the adhesive connection. For this reason, the severing device 6 can introduce a guided disaggregating tool 12 between carrier film 4 and reinforcement edge 2, without vibrations, in order to thereby detach the reinforcement edge 2 from the carrier film 4 in one piece. Of this tool guide 13, which is partially shown according to FIG. 2, its tool holder 30 can be recognized. The reinforcement edge 2 can thereby be removed from the semiconductor wafer without risk, wherein furthermore, an apparatus 1 having a simple design occurs as the result of the use of a disaggregating tool 12.

In general, it should be mentioned that a wafer frame 11 having a carrier film stretched onto it is often referred to as a "film frame," which serves as a carrier for the semiconductor wafer 3.

Figure 2:
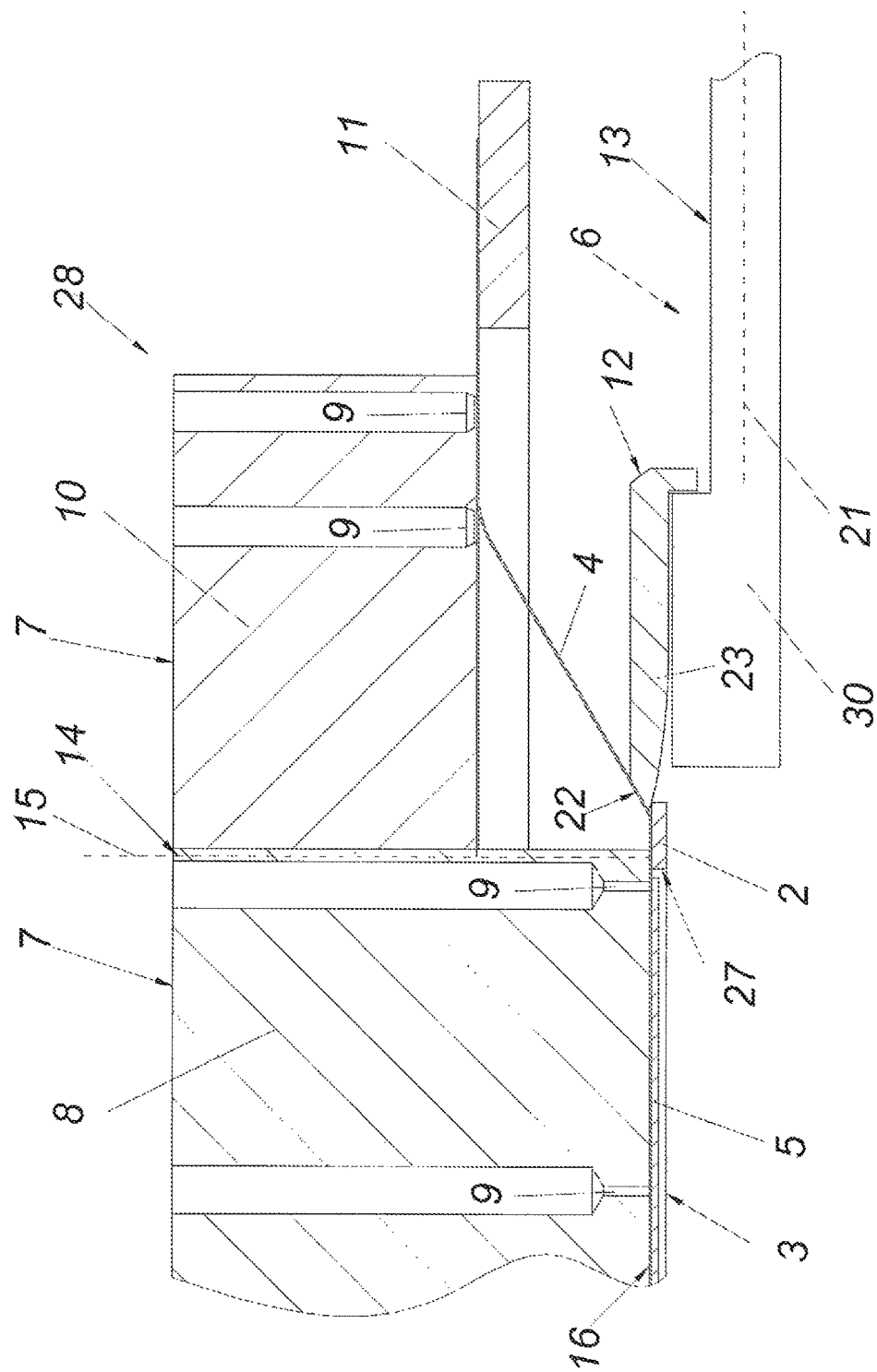
Figure 3:
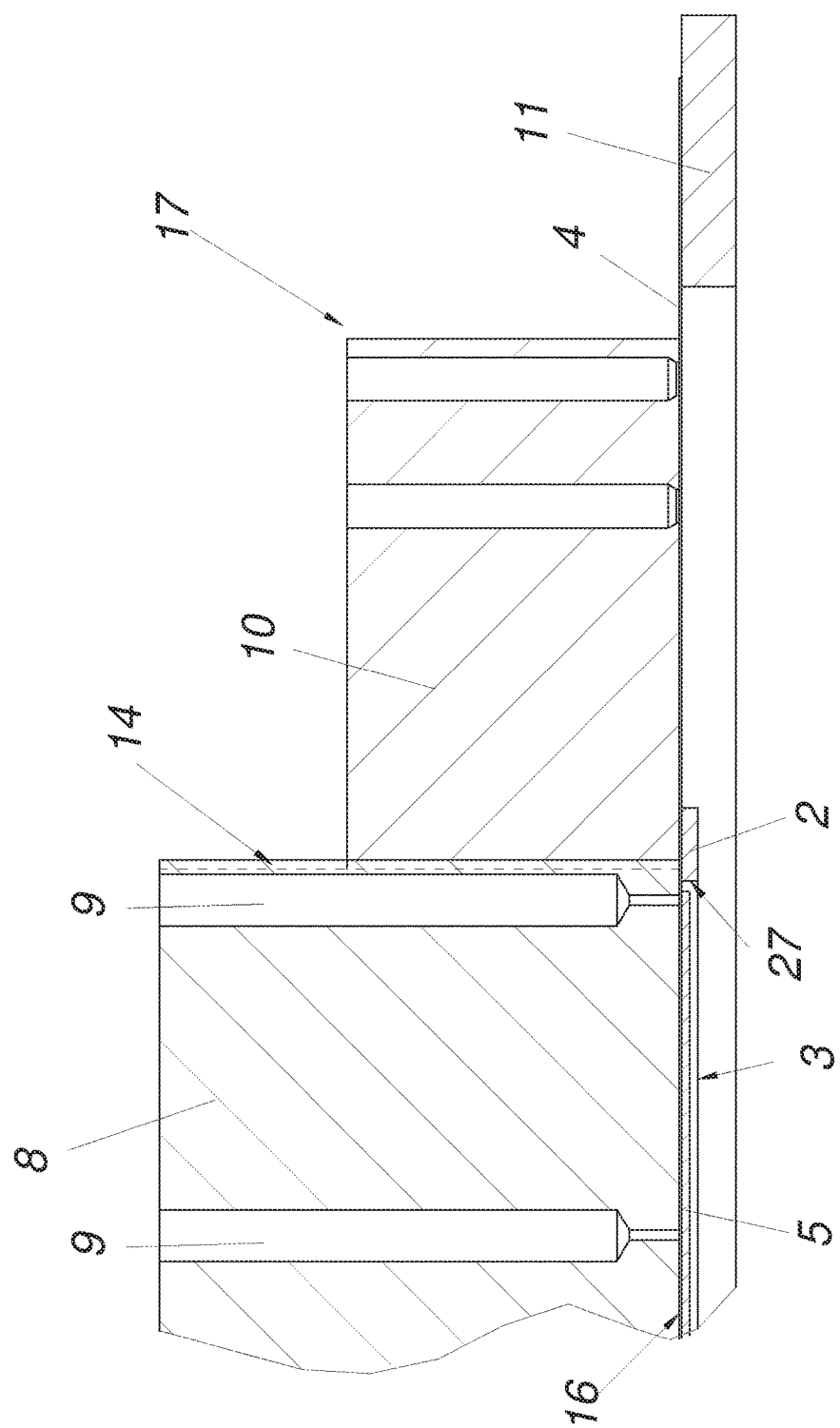

Stretching of the carrier film 4 is achieved using a guide 14 between clamping device 10 and support 8, which guide 14 is structured as a linear slide guide. The guide track 15 of the guide 14 runs perpendicular relative to the support surface 16 of the support 8, thereby making it possible to move the clamping device 10 into a clamping position 28 that is set back relative to the support surface 16, as can be seen in the detail of FIG. 2. In this clamping position 28, the carrier film 4 is expanded or stretched, at least between clamping device 10 and reinforcement edge 2, in order to be able to absorb the vertical displacement of the clamping device 10, which occurs proceeding from a starting position 17 that is planar with the support surface 16. This starting position 17 of the clamping device 10 is shown in greater detail according to FIG. 3.

The reinforcement edge 2 can be uniformly detached from the carrier film in that the reinforcement edge 2 is put into a rotational movement 18 relative to the disaggregating tool 12. For this purpose, a pivot bearing 19 is provided between holding device 7 and disaggregating tool 12 or its tool guide 13. The axis of rotation 20 of the pivot bearing 19 runs perpendicular to the guide axis 21 of the tool guide 13, thereby causing the wedge blade of the disaggregating tool 12 to lift the reinforcement edge 2 from the carrier film 4 in the manner of a lifting tool. For this purpose, the disaggregating tool 12 is structured in the manner of a knife 23.

As indicated in FIG. 1, a radiation source 24 (UV radiation source) that emits ultraviolet radiation is also assigned to the severing device 6. This radiation source 24 is directed at the reinforcement edge 2 and thereby leads to softening of the material-fit connection between carrier film 4 and reinforcement edge 2. Mechanical detachment of the reinforcement edge 2 from the carrier film 4 can thereby be significantly facilitated.

To protect the semiconductor structures of the active wafer surface 5 of the semiconductor wafer 3, a shutter 25 follows the radiation source 24, which shutter restricts the emission 26 of the radiation source 24 to the reinforcement edge 2 of the semiconductor wafer 3.

The semiconductor wafer 3 is drawn against the support 8 by suction, by way of the carrier film 4. In this manner, damage caused by the holding device 7 is prevented. Furthermore, the suction openings 9 of the support 8 run around the inside 27 of the reinforcement edge 2, and thereby form a closed contour. This contour not only ensures protection of the active wafer surface 5, but rather also serves as an attachment border 29 or lift-off edge, in order to facilitate detachment of the reinforcement edge 2, as this edge can be recognized according to FIG. 4.

In general, it should be mentioned that the suction openings 9 can be configured by way of openings distributed over the support 8 and/or in ring shape.

Figure 4:
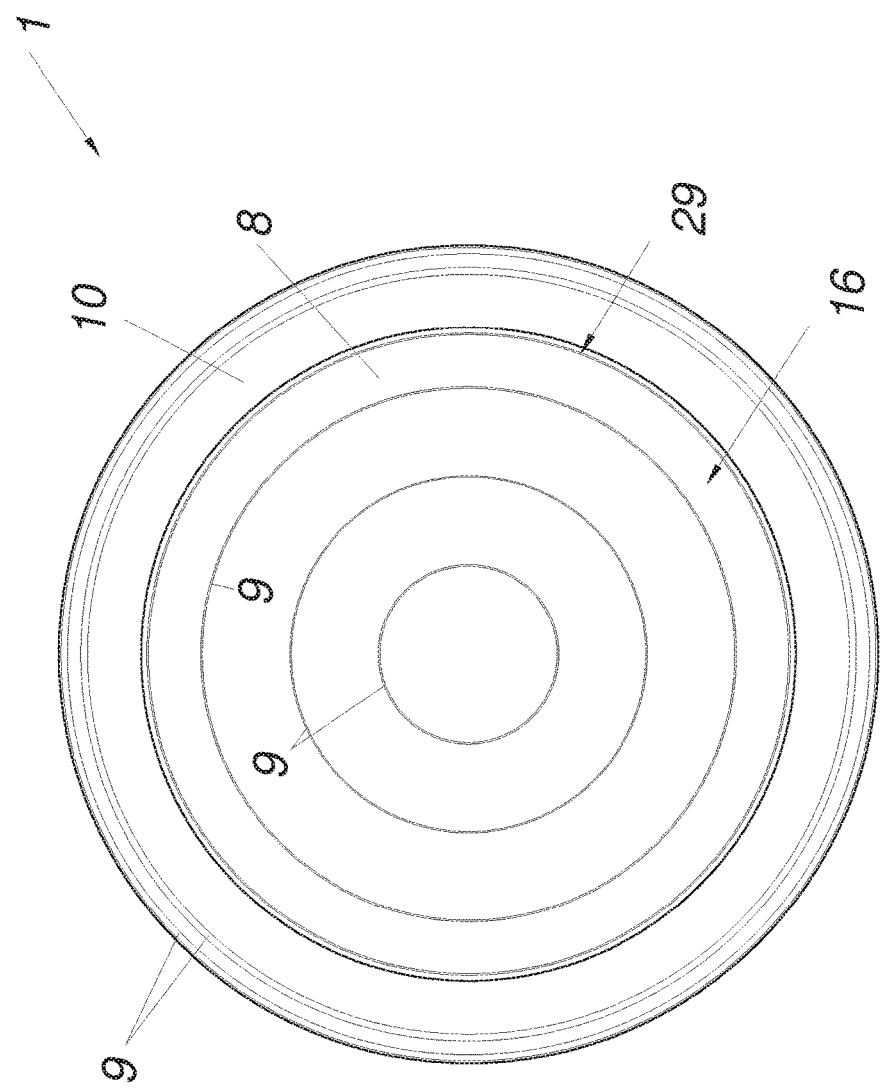

In the apparatus 1 shown according to FIG. 4, without a semiconductor wafer, elastic carrier film, and wafer frame, the support surface 16 of the support 8 can furthermore be recognized. The clamping device 10 follows this support surface 16, with its suction openings 9 that are offset toward the outside. The suction openings 9 of the support 8 and of the clamping device 10 are configured in circular ring shape.

The invention claimed is:

1. Apparatus for removal of a ring-shaped reinforcement edge from a ground semiconductor wafer, which wafer is connected with an elastic film with material fit, the elastic film being a carrier film, the apparatus comprising:
   (a) a circumferential wafer frame, the wafer being attached to the circumferential wafer frame by way of the carrier film,
   (b) a holding device comprising:
      (i) a support comprising a planar support surface and comprising suction openings configured to suck the carrier film from above, wherein via a suction force of the suction openings and via the carrier film (1) the semiconductor wafer and the reinforcement edge are held against the planar support surface and (2) the semiconductor wafer is drawn against the carrier film,
      (ii) a clamping device comprising a clamping surface for holding the carrier film, the clamping device surrounding the support and being configured to clamp the wafer frame and/or the carrier film in place,
      (iii) a guide between the support and the clamping device and comprising a guide track running at an angle relative to the planar support surface of the support,
         wherein the guide bears the clamping device such that the clamping device is movable along the guide track relative to the support from a starting position into a clamping position,
         wherein in the starting position the clamping surface is planar with the support surface, and in the clamping position the clamping surface is set back relative to the support surface, and
         wherein in the clamping position the carrier film held to the support and to the clamping device is stretched in a stretched region between the clamping device and the reinforcement edge so that a peeling stress is put on a connection between the carrier film and the reinforcement edge, and
      (iv) a pivot bearing configured to rotate the holding device around a pivot axis, and
   (c) a severing device configured to detach in one piece the reinforcement edge from the carrier film and comprising a disaggregating tool and a tool guide for moving the disaggregating tool between the stretched carrier film and the reinforcement edge so that the disaggregating tool contacts the reinforcement edge and the carrier film in the stretched region to detach the reinforcement edge from the stretched carrier film, the tool guide moving the disaggregating tool along a guide axis at an angle relative to the pivot axis of the pivot bearing of the holding device.

2. Apparatus according to claim 1, wherein the clamping device has suction openings for drawing the support film and/or the wafer frame in by suction.

3. Apparatus according to claim 1, wherein the disaggregating tool has a wedge blade.

4. Apparatus according to claim 3, wherein the disaggregating tool comprises a knife or a splitter.

5. Apparatus according to claim 1, wherein the severing device has a radiation source directed at the reinforcement edge, for softening the material-fit connection between the carrier film and the reinforcement edge.

6. Apparatus according to claim 5, wherein a shutter for restricting the emission of the radiation source to the reinforcement edge is disposed between the radiation source and the support.

7. Apparatus according to claim 1, wherein the suction openings of the support are disposed to run around the inside of the reinforcement edge.

8. Apparatus according to claim 1, wherein the guide comprises a linear guide.

9. Apparatus according to claim 1, wherein the guide track of the guide runs perpendicularly relative to the support surface of the support.

10. Apparatus according to claim 1, wherein the axis of rotation of the pivot bearing runs perpendicular relative to the guide axis of the tool guide.

\* \* \* \* \*